United States Patent [19]

Browne et al.

[11] Patent Number: 4,994,316

[45] Date of Patent: Feb. 19, 1991

[54] CIRCUIT BOARDS

[75] Inventors: James M. Browne, Pleasant Hill; James J. Jarvis, Martinez, both of Calif.

[73] Assignee: The Dexter Corporation, Pittsburg, Calif.

[21] Appl. No.: 381,753

[22] Filed: Jul. 18, 1989

[51] Int. Cl.⁵ .............................................. B32B 9/00
[52] U.S. Cl. .................... 428/209; 428/411.1; 428/323; 428/325; 428/901; 361/397
[58] Field of Search ............. 428/209, 411.1, 323, 428/325, 901; 361/397

[56] References Cited

U.S. PATENT DOCUMENTS 4,092,629  5/1978  Siems et al. .......................... 370/113
4,134,848  1/1979  Adicoff et al. ....................... 428/429

Primary Examiner—Patrick J. Ryan
Attorney, Agent, or Firm—George A. Skoler

[57] ABSTRACT

An article of manufacture comprising a circuit board construction which comprises a composite of a electronic circuit provided on a dielectric article in which the article comprises a layer of syntactic film.

4 Claims, 2 Drawing Sheets

CIRCUIT BOARDS

BRIEF DESCRIPTION OF THE INVENTION

A novel circuit board construction comprising a composite of a electronic circuit provided on a dielectric substrate in which the substrate comprises one or more layers of a syntactic film.

BACKGROUND TO THE INVENTION

Circuit boards are stiff structures comprised of a dielectric substrate upon which is provided an electronic circuit. Many different techniques have been employed for providing the electronic circuit on the dielectric substrate. This invention is not concerned with the formation of this circuit. Printed circuit techniques well known in the art may be used in practicing this invention. This invention is concerned with the dielectric substrate and includes the relationship of the substrate to the circuit.

Many circuit boards employ fiber reinforced thermosetting resins and thermoplastic polymers as the dielectric substrate upon which the circuit is provided. Such structures have a relatively high weight to volume ratio because of the weight introduced by the fibers, typically glass fibers, and the resin or plastic component. Certain engineering polymers do not require the use of fiber reinforcement for some circuit board applications, but they still introduce a significant weight to volume ratio to the circuit board.

Circuit boards have become significant components in terms of the weight of many articles utilizing computers. In a microcomputer, they may constitute, exclusive of the housing, the single heaviest component(s) in the computer. Computers are now significant components of machines that are transported or otherwise caused to be moved. As a result, the weight introduction of the circuit board to the item utilizing it has become a serious design and materials problem. As more and more computer functions are added to equipment, the weight of the circuit board(s) becomes a materials and design issue not easily resolved. As printed circuits become larger and more complexed, and then multiplied in use, it is evident that reducing the weight of circuit boards is most desirable thing to do.

Printed circuit boards have many important property requirements. They must be stable structures under a wide variety of service requirements. For example, they must be stiff structures that do not warp or buckle under production and use conditions. They must be plateable under relatively severe plating conditions used to create the circuit, without warpage or delamination. They must accept the ambient conditions involved in commercial uses without introducing flaws that affect the circuit's performance.

It is now apparent that there is a commercial need for circuit boards with a combination of such features as
  lower weight
  stiff structures
  high stiffness to weight ratio
  high strength to weight ratio
  high lamination strength
  environmental stability
  platability without warpage or buckling
  low dielectric constant
  faster signal speed
  capable of achieving improved thermal conductivity in select situations
  enhanced fire retardency SynCore ®, sold by Dexter Adhesive and Structural Materials Division, Dexter Corporation, Pittsburg, Calif. 94565 U.S.A., is a syntactic film that takes the place of prepreg plies in stiffness critical structures. This syntactic film is a composite material consisting of microballoons in a matrix resin. A wide variety of microballoons and matrices can be combined to make SynCore ® materials. Glass is the most common microballoo material of construction, but quartz, phenolic, carbon, thermoplastic and metal coated microballoons have been used. Epoxies curing at 350° F. (177° C.) and 250° F. (121° C.) are the most common matrix resins, but matrices of bismaleimide (BMI), phenolic, polyester, PMR-15 polyimide, cyanate esters, and acetylene terminated resins have been used to produce SynCore ® products. In addition, these types of syntactic films may be formed using thermoplastic polymers to form the composite structure. As a result of the wide variety of materials that successfully make SynCore ® products, they are tailorable to a variety of applications. There is a version of SynCore ® available that will cocure with all known available heat-cured composite laminating resins. In that respect, syntactic films made from thermoplastic polymers compatible with other thermoplastics provided within a more complex composite structure is readily achievable.

SynCore ® provides a unique thin film form in isotropic film structures. SynCore ® allows sandwich core concepts to be used in a thinner dimension than previously possible. The thickness limit on honeycomb cores is approximately 0.125 inch. SynCore ® is available in 0.007 to 0.125 inch thicknesses but can be made in thinner or thicker sheet forms. Other core materials such as wood and sheet film can be made thin, but are not drapable and generally require an expensive/heavy adhesive film to bond to the partner composite components. In addition, SynCore ® possess excellent uniformity in thickness which provides the ability to assure quality for the composite in which it is used as a component. SynCore ® is typically used to replace prepreg plies where the intent is to increase stiffness by increasing thickness.

Designing with Syn Core ® is straightforward because all of the analysis methods that apply to other core materials such as honeycomb apply to it. Flexural stiffness of flat plates and beams increases as a cubic function of thickness allowing a lighter, stiffer lamination than could be made from prepreg plies alone. Since SynCore ® on a per volume basis typically costs less than half of a comparable carbon prepreg, it also leads to a lower cost lamination. This is illustrated by the following:

(1) Adding one ply of 0.020 inch SynCore ® and eliminating one ply of prepreg does not change the weight or cost significantly, but nearly doubles the flexural rigidity.

(2) Adding one ply of 0.020 inch SynCore ® and eliminating three plies of prepreg sharply decreases the cost and weight with a small decrease in rigidity.

(3) Adding one ply of 0.040 SynCore ® and eliminating three plies of prepreg provides lower weight, cost and sharply increases rigidity.

(4) The introduction of unidirectional tape allows a further increase in performance at lower cost and weight at nearly the same thickness.

(5) A hybrid tape/fabric/SynCore ® construction gives a very attractive set of weight and cost savings coupled with a 3.4 times increase in flexural rigidity.

SynCore ® has been recommended for thin composite structures in any application where flexural stiffness, buckling, or minimum gauge construction is used. It has been shown to save weight and material cost in carbon fiber composites. It has been been offered to save weight at approximately the same cost in the case of glass fiber composites.

The manufacturing methods for employing SynCore ® are very similar to those used for prepregs. Because it is not cured, it is tacky and very drapable when warmed to room temperature and is easier to layup than a comparable prepreg ply. It can be supplied in supported forms with a light weight scrim to prevent handling damage when it is frozen. It requires cold storage like prepregs, usually 0° F. (−17.7° C.) or below. The various SynCore ® typically have a room temperature out-time that is much longer than their companion prepregs. Because the microballons provide a large degree of flow control, SynCore ® does not show any unusual migration during cure when normal laminate layup and bagging procedures are used. SynCore ® is less sensitive to cure cycle variations than prepreg making the controlling factor the composite cure cycle selection. It will cure void free under full vacuum or low (e.g. about 10 p.s.i.) autoclave pressure. It has been cured at up to about 200 p.s.i. without exhibiting balloon crushing.

In a typical application, a sandwich of SynCore ® and prepreg, such as a thicker layer of SynCore ® between two thinner layers of prepreg, are held together under heat and pressure to cure the structure into a strong panel. Typical sandwich constructions of this nature are shown in U.S. Pat. Nos. 4,013,810, 4,433,068 and 3,996,654. Such composite structures typically are produced in flat sheets and in separable molds to obtain various desired shapes. Moreover, SynCore ® can be precoated on the laminate prepreg before the prepreg is stacked into the composite form, see U.S. Pat. No. 4,284,679, or stacked separately with the prepreg.

Syntactic films may be made by a variety of methods. Typically, the resin or plastic that is used to form the film is first blended with the microballoons and the combination is calendared out as a uniform thin sheet having the uniform dimensions described above. In some instances, the resin or thermplastic polymer containing the microballoon loading is converted into a hot melt from which it may be coated, typically by roller or knife coating, onto the desired substrate. In this fashion, one may produce a thin uniform layer of the syntactic film onto the substrate to which it has been deposited. Hot melt coating is effected without the use of solvent(s) or minimal amounts of solvent(s). Where hot melt coating of thermosetting resins containing microballoons is employed, it is desirable to control the viscosity of the resin by the use of reactive diluents thereby avoiding the need to use solvents in the resin system. This eliminates enviromental and safety problems in applying the syntactic film to the desired substrate. It is well recognized that the pot life of thermosetting resins in hot melt applications will often dictate the hot melt conditions.

THE INVENTION

This invention relates to a novel circuit board construction which comprises a composite of an electronic circuit provided on a dielectric substrate in which the substrate comprises one or more layers of a syntactic film.

More particularly, this invention relates to a novel circuit board comprising a printed circuit deposited onto a dielectric substrate which substrate comprises a laminate structure containing one or more thin uniform layers of a syntactic film. In a desirable embodiment of the invention, the dielectric substrate comprises a laminate structure containing a resin or thermoplastic polymer layer and a syntactic film layer in which the syntactic film comprises a resin or thermoplastic polymer that is either the same as that in the resin or thermoplastic polymer layer or is compatible or reactive with the resin or thermoplastic polymer. In another embodiment of the invention, the dielectric substrate comprises a laminate structure of a resin or thermoplastic polymer layer adhesively bonded to a syntactic film layer. In any one of these laminate structures, there may be used one or more layers of the resin or thermoplastic polymer with one or more layers of the syntactic film layer.

In another embodiment of this invention, the invention relates to novel circuit board construction wherein the electronic circuit is provided directly on a thin layer of a syntactic film and the syntactic film layer comprises the dielectric surface of the circuit board. This embodiment of the invention provides for extremely thin shapeable circuit boards suitably employable in a range of applications where weight, shape and configuration are important considerations. In such applications, the printed circuit may be applied to the substrate by coating techniques such as described in European patent application No. 0 130 462, published Jan. 9, 1985.

DETAILS OF THE INVENTION

Figure 1:
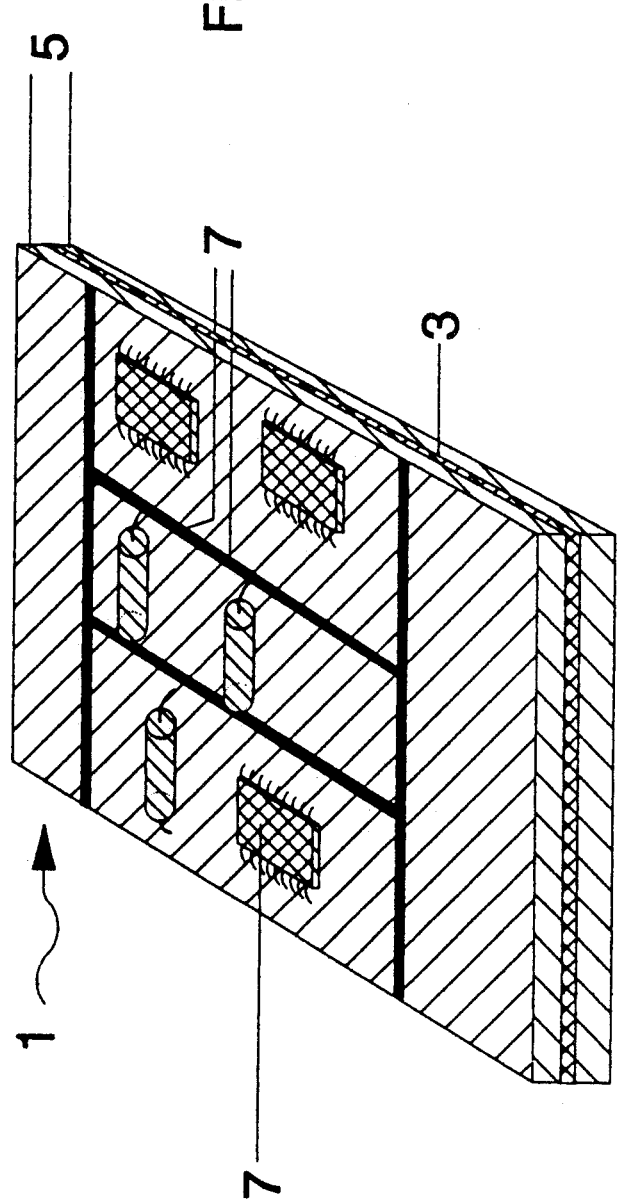
FIG. 1 depicts a perspective view of a circuit board containing electronic devices and a printed circuit, in which the syntactic film comprises a laminated middle layer.

This invention relates to a circuit board construction that materially reduces the weight of the circuit board yet retains at least the equivalent stiffness and dielectic properties of the conventional and comparable circuit board. The invention allows for or enhances the possibility of achieving the maximum utilization of microcircuitry in devices without unduly introducing weight.

An advantage of the dielectric composites of the invention is the lower dielectric constant that is obtainable with syntactic films over those obtainable with conventional dielectric structures. For example, SynCore ® has a lower dielectric constant than typical circuit board laminate material, such as a dielectric constant of about 2.3 at 1 mHz for syntactic film vs. about 4.5 at 1 mHz for the typical laminate materials. Lower power losses are one benefit from this property advantage.

In addition, syntactic films provide an enhanced level of insulation qualities to composite structures containing them. This feature provides a relevant advantage to printed circuit boards containing syntactic films according to this invention. Such insulation qualities protect the electronic components of the circuit board by allowing less heating of these electronic components as their leads are soldered to the printed circuit boards.

Because microballoons typically lower the heat, smoke and toxic gases generated during burning, the composites of this invention exhibit enhanced flame resistance.

The circuit boards of the invention comprise a composite of the electronic circuit, which includes electronic devices included in the circuit, and the dielectric substrate. The improvements characterized herein relates to modifications to the dielectric substrate.

This invention provides circuit boards with a combination of such features as
  lower weight
  stiff structures
  high stiffness to weight ratio
  high strength to weight ratio
  high lamination strength
  enviromental stability
  platability without warpage or buckling
  low dielectric constant
  faster signal speed
  capable of achieving improved thermal conductivity in select situations
  enhanced fire retardency The dielectric substrates of the invention comprise one or more dielectric surfaces upon which the circuitry is placed. The dielectric substrate in any embodiment of the invention is a composite because the syntactic film layer is a composite of microballoons and the resin or thermoplastic polymer matrix. In discussing the dielectric substrate and to distinquish it from the circuit board composite which includes the circuitry, the dielectric substrate is referred to hereinafter as the "dielectric composite" whereas the circuit board composite including the circuitry is referred to hereinafter as the "circuit board composite".

The circuitry provided on the circuit board composite may be located on any surface of the dielectric composite, including the edges of the dielectric composite. Thus the circuitry may be wrapped around the dielectric composite to provide any range and capability of circuitry. The circuitry may be provided on the dielectric composite by etching and plating, by painting including silk screening, and the like. Any technique known in the art for depositing a circuit on a dielectric substrate may be used in the practice of the invention.

The dielectric composite of the invention is derived from the use of a layer of syntactic film. The choice of syntactic film used in the dielectric composite of the invention is dependent upon the circuit board application and the requirements of the application. If the application requires considerable strength for the circuit board, then the dielectric composite should contain a fiber reinforced layer which is bonded to the syntactic film layer. If the printed circuit board is subjected to etching and plating, the dielectric composite should contain a resin or plastic which is solder resistant for the matrix of the fiber reinforced layer and the syntactic film layer. Such property distinctions are well understood in the art and therefore raw materials selection is well within the purview of the routineer.

Where the dielectric composite utilizes a fiber reinforced layer, the layer may be formed by conventional techniques in the art. For example, where the layer is made of chopped fiber reinforcement, then the layer may be formed by wetting a layer of the chopped fibers with the thermosetting resin or the thermoplastic polymer, and the mass may be shaped by a variety of molding processes, such as transfer molding, compression molding, injection molding, thermoforming, and the like. However, where the syntactic film layer is a material like SynCore ®, it may be more desirable to deposit the wetted layer of chopped fibers onto the layer of SynCore ® and the composite of the two are compression molded to the desired shape of the dielectric composite.

Where the dielectric composites of the invention comprise at least one resin or thermoplastic layer containing a continuous filamentary fiber, then it is desirable to utilize prepreg technology in forming that layer. In that case, the dielectric composite will contain at least one (1) layer of a prepreg of unidirectionally or multidirectionally aligned continuous filaments, generally fibers possessing a high modulus, impregnated in a thermosetting resin or thermoplastic polymer, and bonding the layer(s) to at least one isotropic layer a thin film of uniform thickness of syntactic film comprising rigid microballoons in a thermosetting resin or thermoplastic polymer matrix chemically bonded, in the case of the thermosetting resin, or melt compatible, in the case of the thermoplastic polymer, to such prepreg, such as through other prepreg chemically or melt bonded within the composite. The term "chemically bonded" means the adhesion of one layer to another in the composite by associative, covalent, ionic or hydrogen, and the like, bonding.

The syntactic film comprising rigid microballoons in a thermosetting resin or thermoplastic polymer matrix may comprise a sandwiched component of the dielectric composite, an outer layer of the dielectric composite or a combination of the two. Obviously, the invention contemplates the location of the syntactic film in the dielectric composite in a manner which accords with the intended application of the circuit board composite.

The invention is illustrated by the drawings. With respect to FIG. 1, there is shown a printed circuit board 1 comprising printed circuit 7 containing a number of electronic devices 7 adhesively or mechanically bonded to the top surface of one of the outer layers 5. Each outer layer 5 is a fiber reinforced composite based on a thermosetting resin or thermoplastic polymer matrix for the fiber reinforcement. Layer 3, sandwiched between layers 5, is a syntactic film layer comprising rigid microballoons enclosed by either a thermosetting resin or thermoplastic polymer matrix that is complimentary, as discussed previously, to that contained in layers 5 as the matrix component. In making the circuit board composite of FIG. 1, the dielectric composite is made first, followed by the deposition and installation of the electronic circuit on one or more surfaces of the dielectric composite.

The dielectric composite may be made by depositing a thin layer of the syntactic film onto a surface of one layer of the composite layer 5. If the matrix material of layer 5 is a thermoplastic polymer, then the matrix material of layer 3 will be either the same thermoplastic polymer or one that is compatible with it. However, if the matrix material of the layers 5 is a thermosetting resin, then the matrix material of layer 3 will be either the same thermosetting resin, the preferred choice, or a resin that is capable on curing to effect a chemical bond with the thermosetting matrix resin of layers 5.

This invention also contemplates the use of adhesives to bond the various layers of the dielectric composite of FIG. 1. In most cases, the adhesive will contain functional groups complimentary to those of the matrix materials of the various layers 3 and 5. Functional groups are chemical groups in the adhesive which are capable of effecting a chemical bond with functional groups in the matrix materials of the layers being bonded. For example, an olefinic group is a functional group with another olefinic group and an isocyanate or oxirane group is a functional group with an active hydrogen containing group.

Figure 2:
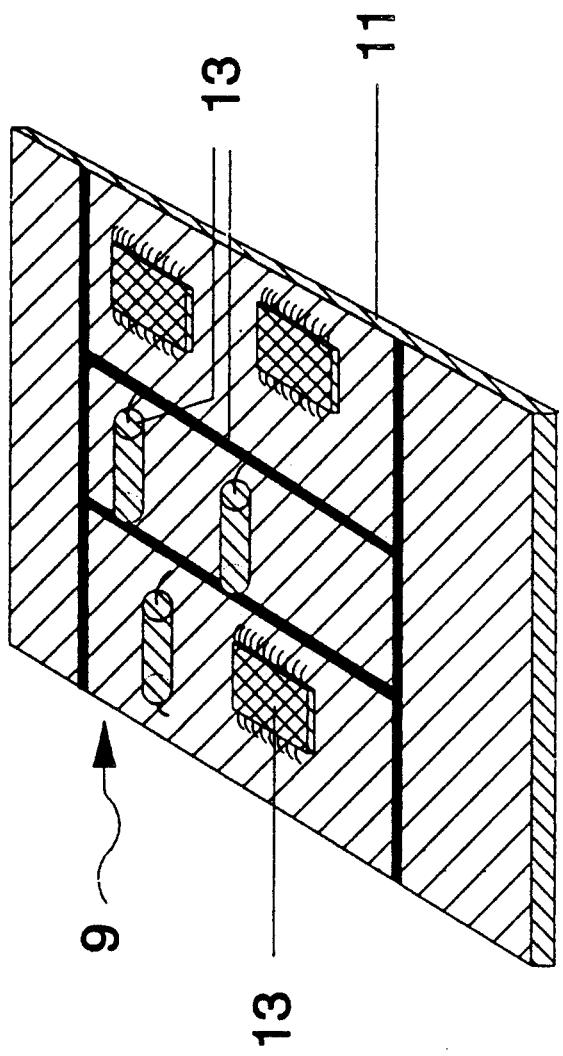
FIG. 2 depicts a perspective view of a circuit board containing electronic devices and a printed circuit, in which the syntactic film comprises the dielectric substrate.

FIG. 2 shows a printed circuit board composite 9 that utilizes a dielectric composite 11 comprising only a layer of a syntactic film. Composite 9 contains electronic surface mounted devices and circuit 13 ( viz. flat packs and dips) on at least one of the surfaces of dielectric composite 11.

The syntactic films used in the practice of the invention comprise thin films of essentially uniform thickness which contain rigid microballoons uniformly dispersed in a resin matrix. They may be any of the SynCore ® syntactic films. The syntactic film suitable for use in the practice of the invention desirably possesses cocurable qualities with the prepreg when the matrix of each is a thermosetting resin. It should be appreciated in making the composite products of the invention utilizing thermosetting resin matrices, that both the fiber reinforced layer and the syntactic film comprising rigid microballoons are in resin matrices which are not fully cured prior to the construction of the composite of them, and only after deriving the desired dielectric substrate construction is the combination cured. However, where the matrix materials are thermoplastic, they may each be solid when they are combined and through heat and pressure, they are caused to sufficiently soften that they can be caused to interbond on cooling.

The syntactic film contains rigid microballoons in a resin matrix. The microballoons (microspheres) are embedded in the uncured or partially cured matrix resin. When the matrix resin of the syntactic film is a thermosetting resin, it may be any of the common thermosetting resins. Generally, the matrix resin is the typical high performance thermosetting or thermosettable resins. The combination of the rigid microballoons and the resin results in a syntactic film suitable for forming a dielectric composite structure. The resin may be any of those thermosetting or thermosettable resins employed in the manufacture of advanced compositions. The most common class of resins are the epoxy resins. They are frequently based, inter alia, on one or more of -hydroxyphenyl)propane) or symtris(4-hydroxyphenyl)propane or halogenated bisphenol-A, their polyepoxide condensation products, cycloaliphatic epoxides, epoxy-modified novolacs (phenol-formaldehyde resins) and the epoxides derived from the reaction of epichlorohydrin with analine, o-, m- or p-aminophenol methylene dianaline. Illustrative resins are epoxies curing at 350° F. (177° C.) and 250° F. (121° C.).

Other thermosetting or thermosettable resins include the bismaleimide (BMI), cyanate esters, phenolic, polyester (especially the unsaturated polyester resins typically used in SMC production), PMR-15 polyimide and acetylene terminated resins have been found suitable in the practice of the invention.

When the matrix material used in the syntactic film is a thermoplastic material, it is desirable to use a performance plastic as the matrix material. Desirable performance plastics are the engineering polymers such as amorphous thermoplastic polymers as the polyarylethers having a reduced viscosity sufficiently high to make them tough, that is, they form tough films. Generally, that means the polymers have a reduced viscosity of at least 0.4. Illustrative of such polyaryl ethers are the various polymers depicted in Johnson and Farnham, U.S. Pat. No. 4,108,837, patented Aug. 22, 1978, and U.S. Pat. No. 4,175,175, patented Nov. 20, 1979, and includes the polyethersulfones ("PES") and polyetherimides (PEI) of the repeating formulae:

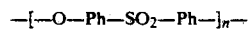

and

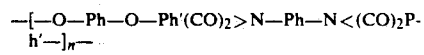

and the polyarylsulfones of the repeating formulae:

—[—Ph—Ph—SO$_2$—]—
—[—Ph—SO$_2$—Ph—O—]—,

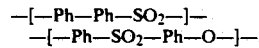

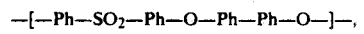

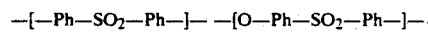

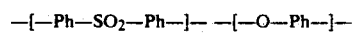

wherein Ph is 1,4-phenylene, Ph' is phenylene in which the carbonyls (CO) are carbon bonded to ring carbons thereof that are ortho as to each other and each ether oxygen (O) is bonded to a ring carbon thereof that is para to one of the ring carbons to which is bonded one of the carbonyls, n has a value sufficient to provide a reduced viscosity of at least about 0.4, as prepreg matrix resins. The polyethersulfone and the polyarylsulfone of the formula —[—Ph—Ph—SO$_2$—]— —[—Ph—SO$_2$—Ph—O—]— are available as Victrex ® PES and 720P, respectively, from ICI Advanced Materials, Wilmington, DE 19897, and the polyetherimide is available as Ultem ® from General Electric Company Company, Plastics Business Group, Pittsfield, MA. The remaining polyarylsulfones are available from Amoco Performance Products, Inc., Ridgefield, CT. under the name Radel ® R and A-400.

Crystalline engineering thermoplastic polymers such as PEEK, sold by ICI Advanced Materials, Wilmington, DE 19897, may be used in this application.

The most common of the microballoons are made of glass, but quartz, phenolic, carbon, thermoplastic and metal coated microballoons are useable. The microballoons are synthetic hollow microspheres that comprise individual round spheres or bubbles having diameters which range from about 1 to about 500 microns, preferably about 1 to about 200 microns, with wall thickness of about 0.1 to about 20 microns. They typically possess densities ranging from about 0.1 to about 0.5 g./cc. The syntactic film comprising the rigid microballoons in a resin matrix, as a result have relatively low densities such as densities ranging from about 0.5 to about 0.7 g./cc. The syntactic film comprising rigid microballoons in a resin matrix is often provided with a scrim support layer for the purpose of assisting is the handling and support of the syntactic film layer. In describing this invention, such scrims are frequently treated as integral components of the syntactic film. Thus the term syntactic film includes such handling assisting layers such as scrims.

The syntactic films have a thickness ranging from about 0.007 to about 0.125 inch and each film is uniform in thickness. Combinations of the syntactic films of different thickness can be used to provide thicker sheet forms.

In the typical case where prepregs are used in forming the dielectric composite, the prepreg comprises continuous filaments of high performance materials such as those having a melting point ($T_m$) or glass transition temperature ($T_g$) of at least about 130° C. Suitable filaments include, by way of example, glass filaments, carbon and graphite filaments, aromatic polyamides (polyphenyleneterephthalamide) such as Kevlar®, quartz, metal fibers such as aluminum, steel and tungsten, boron fibers, and the like.

The filaments are typically bundled into tows and the tows are assembled and spread out into a relatively thin sheet which is either coated or impregnated by the matrix resin. The matrix resin is the typical high performance thermosetting or thermosettable resins or a thermoplastic polymer. The combination of the filament and the resin or polymer results in a prepreg suitable for forming an advanced composite structure. The resin may be any of those thermosetting or thermosettable resins employed in the manufacture of advanced compositions. The most common class of resins are the epoxy resins. They are frequently based, inter alia, on one or more of diglycidyl ethers of bisphenol-A (2,2-bis(4-hydroxyphenyl)propane) or sym-tris(4-hydroxyphenyl)propane or halogenated bisphenol-A, their polyepoxide condensation products, cycloaliphatic epoxides, epoxy-modified novolacs (phenolformaldehyde resins) and the epoxides derived from the reaction of epichlorohydrin with analine, o-, m- or p-aminophenol methylene dianaline. Illustrative resins are epoxies curing at 350° F. (177° C.) and 250° F. (121° C.). Other thermosetting or thermosettable resins include the bismaleimide (BMI), cyanate esters, phenolic, polyester (especially the unsaturated polyester resins typically used in SMC production), PMR-15 polyimide and acetylene terminated resins have been found suitable in the practice of the invention.

However, the prepreg may utilize a thermoplastic polymer as the matrix material and in that case, the syntactic film generally utilizes the same polymer. The preferred thermoplastic polymers are the aforementioned amorphous and crystalline engineering polymers.

The composite of the prepreg and the syntactic film comprising rigid microballoons in a resin matrix may be formed in many ways, as illustrated by the following:

One or more layers of syntactic film comprising rigid microballoons in a resin matrix are first laid up upon a form to form a syntactic film layer and one or more layers of the prepreg are placed upon the syntactic film layer(s) to form a prepreg layer. The uncured composite is then put into an oven and the composite is brought to the cure temperature of the resins in both types of layers.

Two separate layers of prepreg are each unwound from separate rolls and a layer of the syntactic film comprising rigid microballoons in a resin polymer matrix is unwound from another roll, and the two layers of prepreg are laid about the layer of syntactic film to enclose the layer of the syntactic film and form a composite sandwich. The superimposed layers are then heated, preferably under heat and pressure to form a solid (cured) composite that may be cut into dielectric boards that can be etched and plated into circuit boards.

A prepreg of continous filaments or a conventional fiber reinforced polyester, phenolic or epoxy resin sheet as typically used as dielectric substrates in circuit boards may be roller coated with a hot melt thermosetting resin loaded with stiff microballoons. With this technique, a thin uniform syntactic film coating that tightly bonds to the prepreg or sheet is formed. The hot melt coating may thereafter be cured to provide a tight bond of the syntactic film to the adjacent layer. This is effected by placing the uncured composite in an oven and the composite is brought to the cure temperature of the resins in both layers.

We claim:

1. An article of manufacture comprising a circuit board construction which comprises a composite of a electronic circuit provided on a dielectric article in which the dielectric article contains a multilayer laminate structure provided with one or more uniform layers of a syntactic film having a thickness ranging from about 0.007 to about 0.125 inch.

2. The article of claim 1 wherein the laminate structure contains a thermosetting resin or thermoplastic polymer layer and a syntactic film layer in which the syntactic film comprises a thermosetting resin or thermoplastic polymer that is either the same as that in the resin or thermoplastic polymer layer or is compatible or reactive with the resin or thermoplastic polymer.

3. The article of claim 1 wherein the dielectric article comprises a laminate structure of a resin or thermoplastic polymer layer adhesively bonded to a syntactic film layer.

4. The article of claim 1 wherein the electronic circuit of the circuit board is provided directly on a thin layer of a syntactic film and the syntactic film layer comprises the dielectric surface of the circuit board.

* * * * *